(12) United States Patent
Lai

(10) Patent No.: US 6,828,197 B1
(45) Date of Patent: Dec. 7, 2004

(54) METHOD FOR FABRICATING NITRIDE READ ONLY MEMORY

(75) Inventor: Erh-Kun Lai, Taichung (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 10/797,042

(22) Filed: Mar. 11, 2004

(30) Foreign Application Priority Data

Oct. 27, 2003 (TW) .................................... 92129733 A

(51) Int. Cl.$^7$ .......................................... H01L 21/8246
(52) U.S. Cl. ..................................... 438/275; 438/276
(58) Field of Search ................................ 438/275–278

(56) References Cited

U.S. PATENT DOCUMENTS 5,908,311 A    6/1999  Chi et al.
6,610,586 B1 *  8/2003  Liu ............................ 438/526

* cited by examiner

Primary Examiner—H. Jey Tsai
(74) Attorney, Agent, or Firm—Birch, Stewart, Kolasch & Birch, LLP

(57) ABSTRACT

A method for fabricating a nitride read-only memory. The memory region is integrated with a peripheral circuit region, with a polysilicon layer acting as word line in the memory region to serve as an insulator polishing stop layer with the insulator formed in the first shallow trenches in the peripheral region by disposing an oxide layer, wherein the insulator is simultaneously formed between polysilicon structures in the memory array region to prevent semiconductor substrate reaction with metal such as cobalt during salicidation of the polysilicon, and the ONO layer formed on the sidewalls of the shallow trenches avoids STI corner recess and profile deformation during thermal process.

19 Claims, 7 Drawing Sheets

METHOD FOR FABRICATING NITRIDE READ ONLY MEMORY

This Nonprovisional application claims priority under 35 U.S.C. § 119(a) on Patent Application No. 092129733 filed in TAIWAN on Oct. 27, 2003, the entire contents of which are hereby incorporated by reference.

BACKGROUND OF THE INVENTION

1. Field of the Invention

The present invention relates generally to a method of fabricating a non-volatile memory, and more particularly to a method of fabricating a nitride read-only memory wherein the memory region is integrated with the peripheral circuit region.

2. Description of the Related Art

In the non-volatile memory industry, the development of nitride read-only memory started in 1996. Nitride read only memory is a semiconductor device for data storage. It is composed of a plurality of memory cells, each comprising a MOS transistor and an ONO gate dielectric layer. Since the silicon nitride layer in the ONO gate dielectric layer is highly dense, hot electrons can be trapped in the silicon nitride layer by way of tunneling through the MOS transistor, in order to store data. The new non-volatile memory technology utilizes oxide-nitride-oxide (ONO) gate dielectric and known mechanisms of program and erase to create two separate bits per cell. Thus, the NROM bit size is half the cell region. Since silicon die size is a main element in cost structure, it is apparent why the NROM technology is considered an economical breakthrough.

Although nitride read only memory has the advantage of two-bit multi-storage function, a simpler manufacturing process than similar products, and these widely welcomed by the market, the semiconductor industry is more and more orienting itself toward the development of system on chip (SOC) products to allow a single chip to comprise multiple memory and peripheral circuits. In U.S. Pat. No. 5,908,311, a method of forming peripheral circuits comprising flash ROM is disclosed. Based on different characteristics and applications of nitride read only memory and flash ROM, it is important to develop a system-on-chip integrating NROM with peripheral circuits.

SUMMARY OF THE INVENTION

An object of the invention is to provide a method of fabricating a nitride read-only memory, wherein the memory region is integrated with the peripheral circuit region to provide simplified manufacture and high yield.

The above objects are accomplished by providing a method of fabricating a nitride read-only memory comprising disposing a polysilicon layer as word lines in the memory region to serve as an insulator polishing stop layer formed in the first shallow trenches in the peripheral region by disposing an oxide layer, wherein the insulator is simultaneously formed between polysilicon structures in the memory array region to prevent reaction with metal such as cobalt during salicidation of the polysilicon. An ONO layer is formed on the sidewalls of the shallow trenches to avoid STI corner recess and dislocation of the STI profile deformation during thermal process. The method of the present invention comprises providing a semiconductor substrate, including a memory region and a peripheral circuit region therein growing a pad oxide on the semiconductor substrate forming a plurality of parallel buried diffusion regions as bit lines in the memory region; forming a first shallow trench and a second shallow trench in the peripheral circuit region; conformally forming an ONO film on the semiconductor substrate depositing a polysilicon layer on the ONO film to fill the first shallow trenches and the second shallow trench patterning the polysilicon layer to define a plurality of polysilicon structures to serve as word lines having gaps therein, in the memory region so as to remove the polysilicon filled in the first shallow trenches and leave the polysilicon layer filled in the second shallow trench in the peripheral circuit region forming an insulator in the first shallow trenches and the gaps between the word lines planarizing the insulator to leave shallow trench isolations in the first shallow trenches between the word lines, selectively etching the polysilicon structures and the ONO layer to expose the semiconductor substrate between the first shallow trenches and implanting dopants into the substrate between the first shallow trenches to define the well regions. The bit lines are formed by implanting N-type ions such as Phosphorous or Arsenic into the substrate, the gate dielectric layer is formed with the ONO layer, and the word lines are formed with polysilicon.

DESCRIPTION OF THE DRAWINGS

The above and other objects, features, and advantages of the present invention will become apparent from the following detailed description of preferred embodiments of the invention explained with reference to the accompanying drawings, in which.

DETAILED DESCRIPTION OF THE INVENTION

A preferred embodiment of the present invention is now described with reference to FIGS. 1 to 12.

Figure 1:
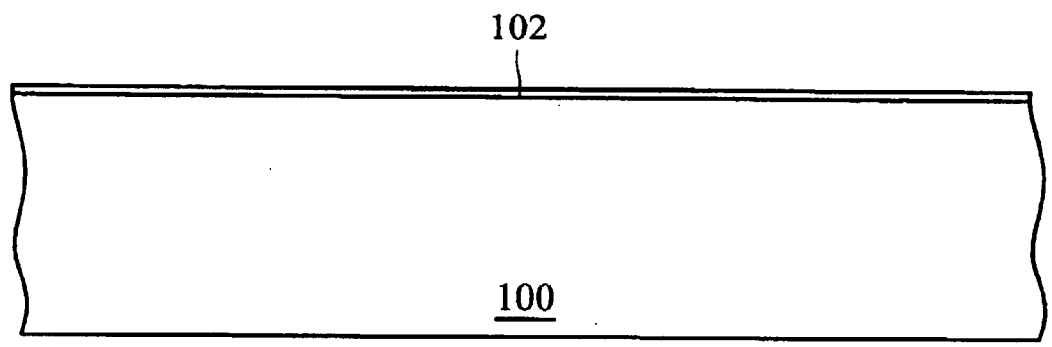
FIGS. 1-8 and FIGS. 10-12 are cross-sections of the method for fabricating a nitride read-only memory and integrating the same with the peripheral circuit region of the invention.
Figure 2:
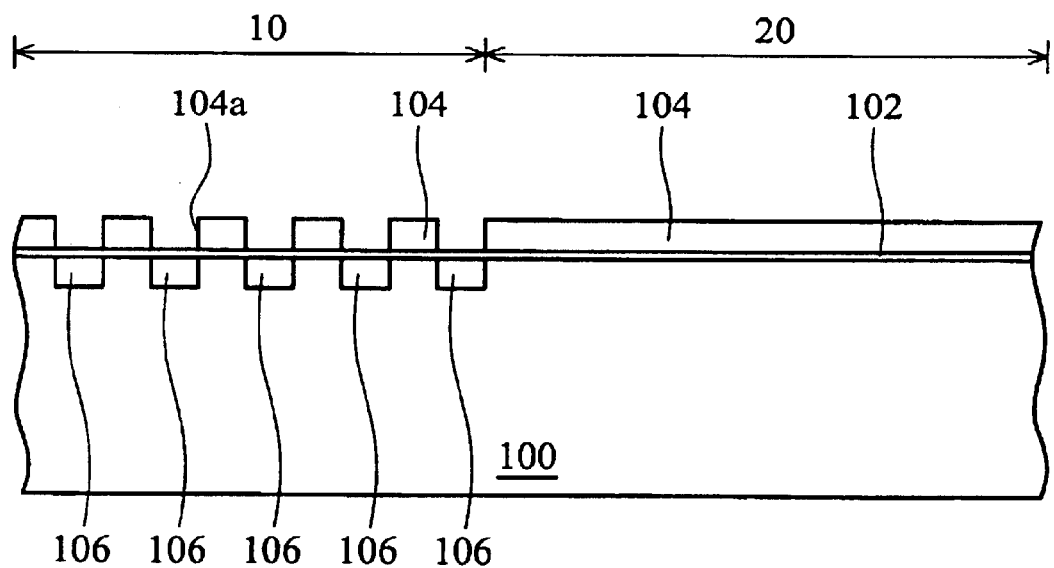

As shown in FIG. 1, a semiconductor (P-type single crystalline silicon) substrate 100 formed with a silicon-on-insulator (SOI) substrate or a silicon substrate includes a memory region 10 and a peripheral circuit region 20 therein. A pad oxide 102 is grown on the semiconductor substrate 100 by thermal oxidation. Next, referring to FIG. 2, a first photoresist pattern 104, serving as an implanting mask, is formed on the pad oxide 102 in the memory region 10 by photolithography. The first photoresist pattern 104 has a plurality of first openings 104a. A plurality of parallel buried diffusion regions 106, serving as bit lines, is formed by implanting N-type ions such as Phosphorus or Arsenic into the semiconductor substrate 100. A a rapid thermal annealing (RTA) is performed to active the ions implanted into the substrate 100.

Figure 3:
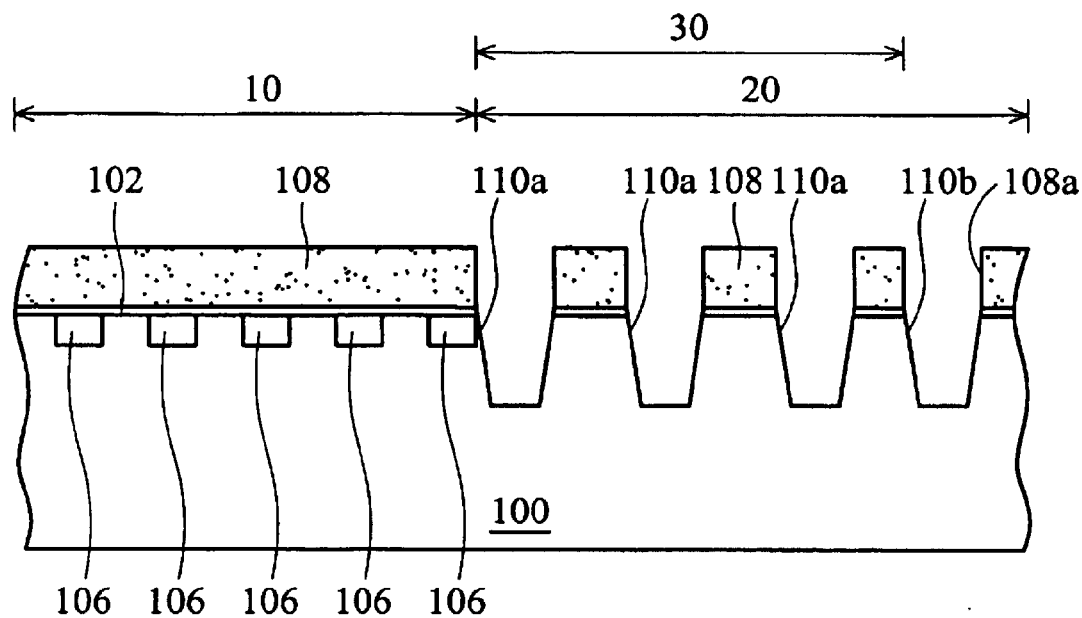

As shown in FIG. 3, the photoresist pattern 104 is removed by a conventional stripper. A second photoresist pattern 108 etching shallow trenches 110a and 110b is formed by photolithography on the pad oxide 102 of the peripheral circuit region 20. The second photoresist pattern 108 has a plurality of second openings 108a. Then, a plurality of first shallow trenches 110a and a second shallow trench 110b are created by reactive ion etching (RIE) with the photoresist pattern 108 is used as a mask. The peripheral circuit region 20 is separated into a plurality of circuit isolated active regions 30 by forming the first shallow trenches 110a.

Figure 4:
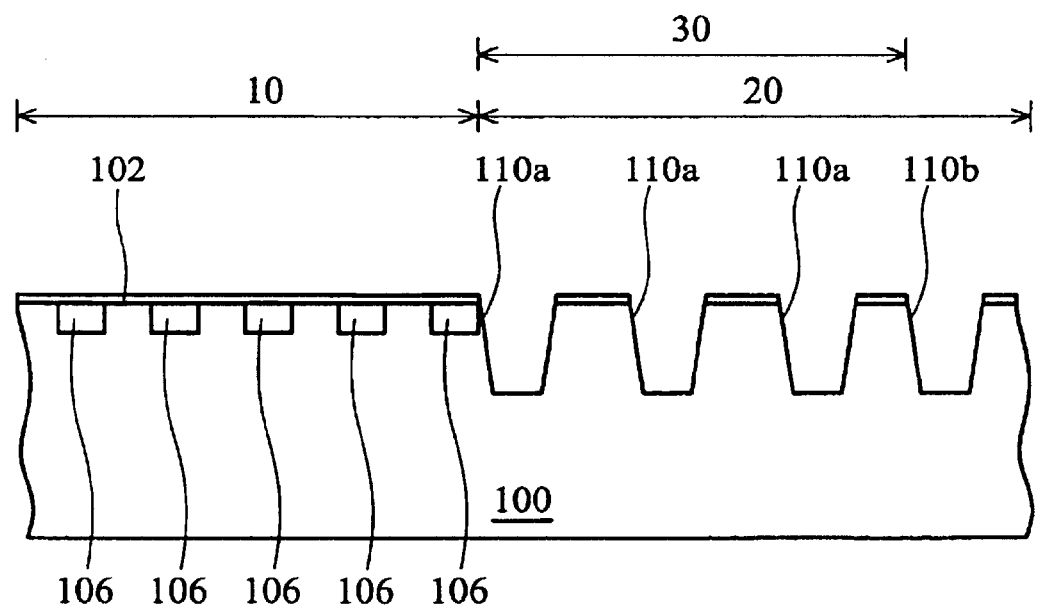

In FIG. 4, the photoresist pattern 108 is removed by a conventional stripper until the pad oxide 102 is exposed. Then, the pad oxide 102 is removed to expose the upper surface of the semiconductor substrate 100 as shown in FIG. 4.

Figure 5:
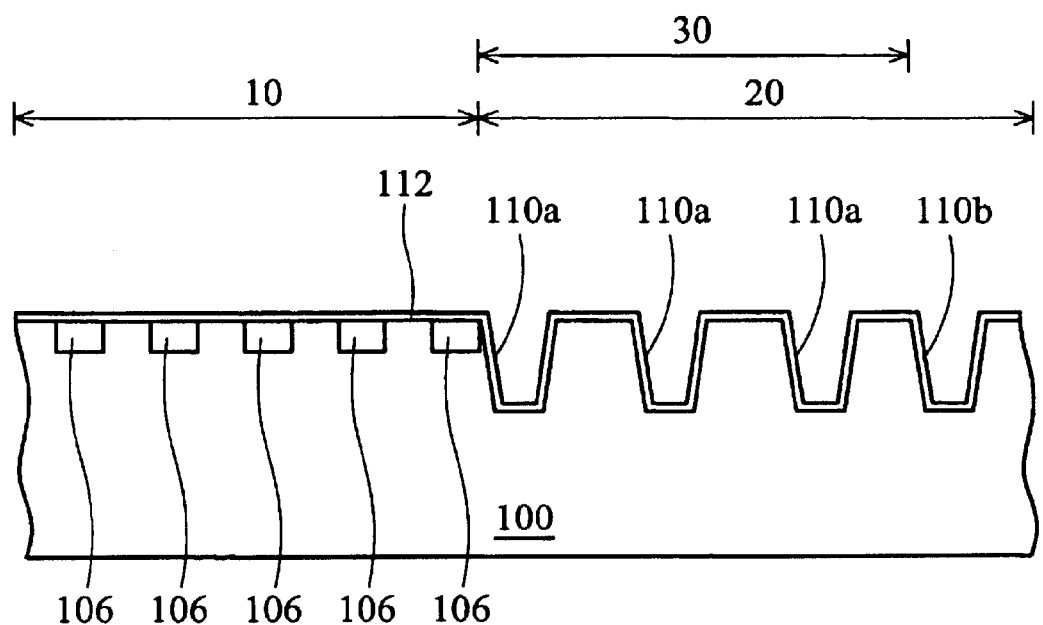

Next, as shown in FIG. 5, an ONO layer 112 is conformally formed on the exposed semiconductor substrate 100 having buried diffusion regions 106 and shallow trenches 110a and 110b, by the conventional method. The ONO layer 112 is formed as the gate dielectric layer in the buried diffusion region 106. The ONO composite layer, having a thickness of about 150 to 250 Å consists of a bottom oxide layer, a nitride layer and a top oxide layer having thicknesses of about 20 to 150 Å, about 20 to 150 Å and about 30 to 150 Å. Espectively, it can be formed before implantation of the parallel buried diffusion region 106. Additionally, the ONO layer 112 formed on the sidewalls of the shallow trenches 110a and 110b avoids the STI corner recess and profile deformation during thermal process resulting in dislocation.

Figure 6:
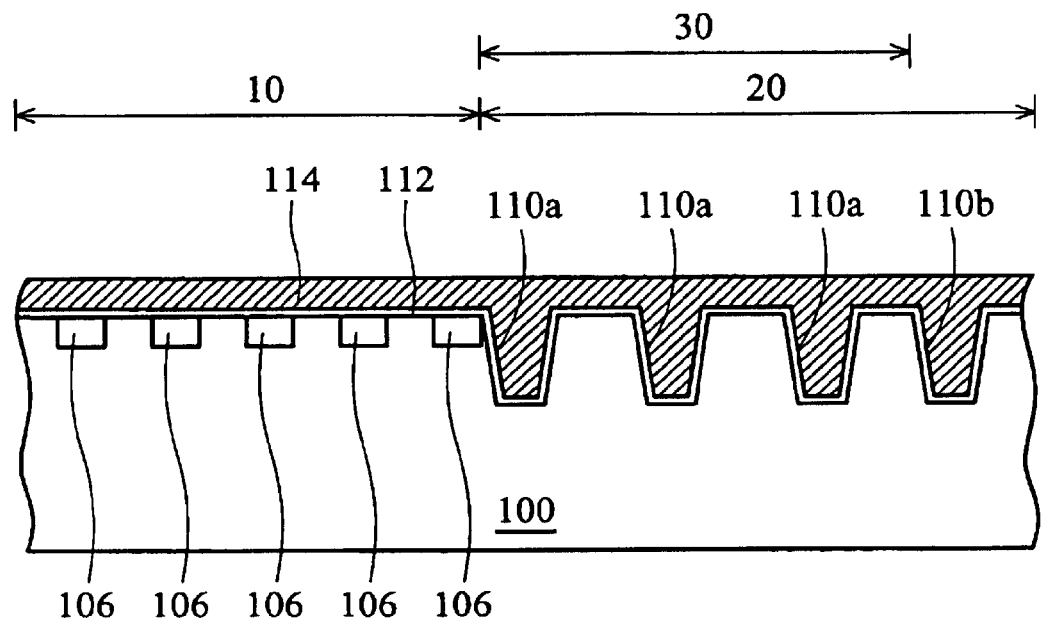

Afterward, referring to FIG. 6, a doped polysilicon layer 114 is deposited on the ONO layer 112 to fill shallow trenches 110a and 110b in the peripheral circuit region as an insulator polishing stop layer (not shown) and the doped polysilicon layer 114 deposited in the memory region 10 serving as word lines.

Figure 7:
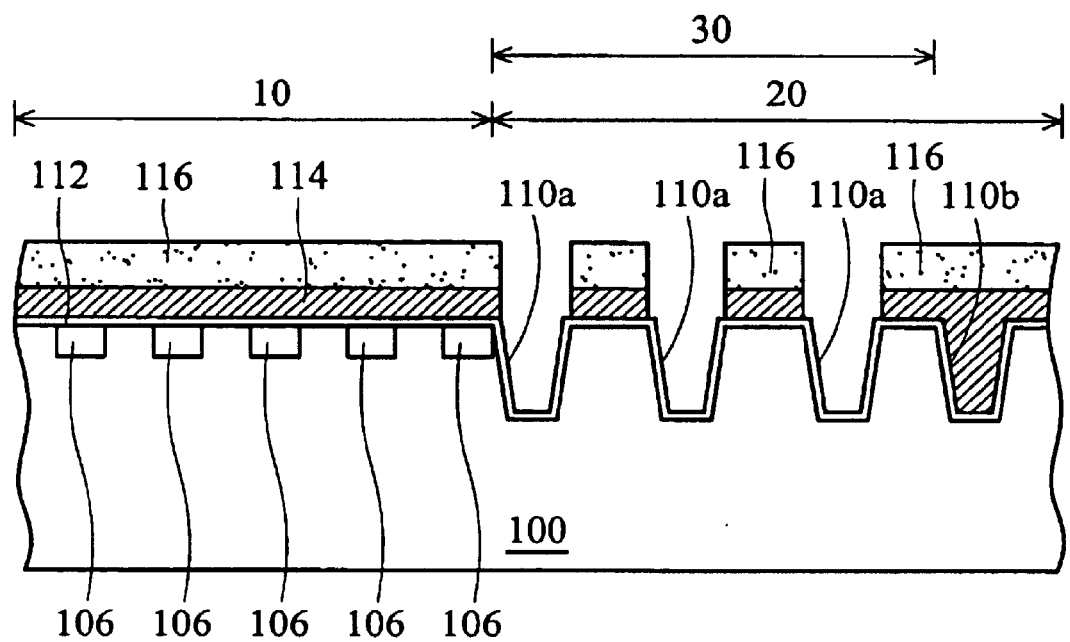

Next, as shown in FIG. 7, a photoresist pattern 116 is formed on the doped polysilicon layer 114 to define a plurality of parallel polysilicon structures intersecting the underlying bit lines as word lines in the memory region and remove polysilicon material form the first shallow trenches 110a. Next, the photoresist pattern 116 is used as an etching mask to expose the ONO layer 112 and the polysilicon layer 114 remains to serve as word lines in the memory region 10.

Figure 8:
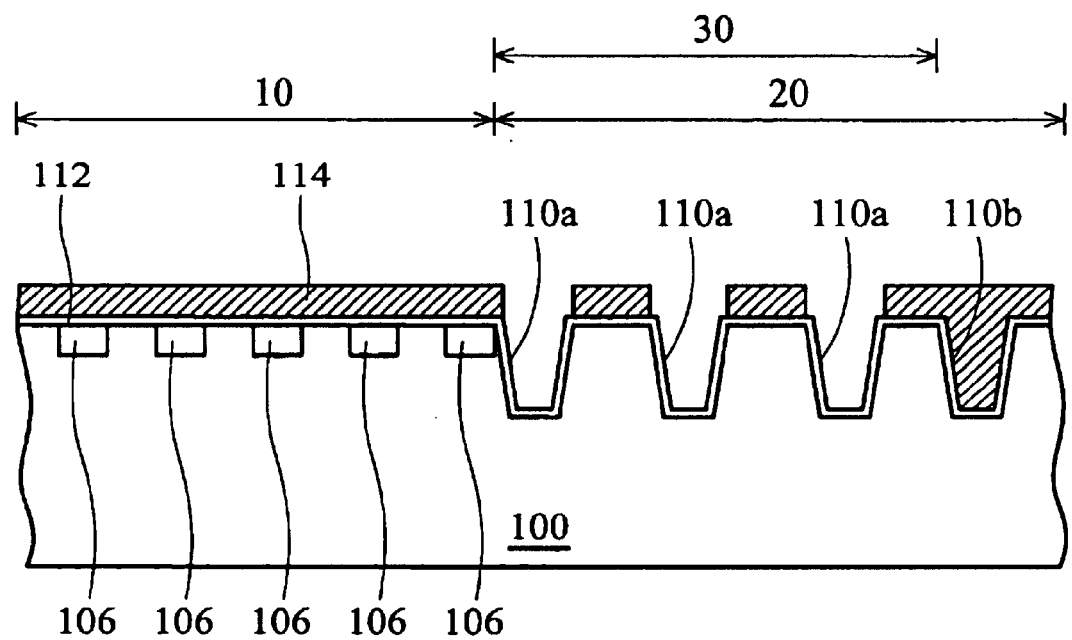
Figure 9:
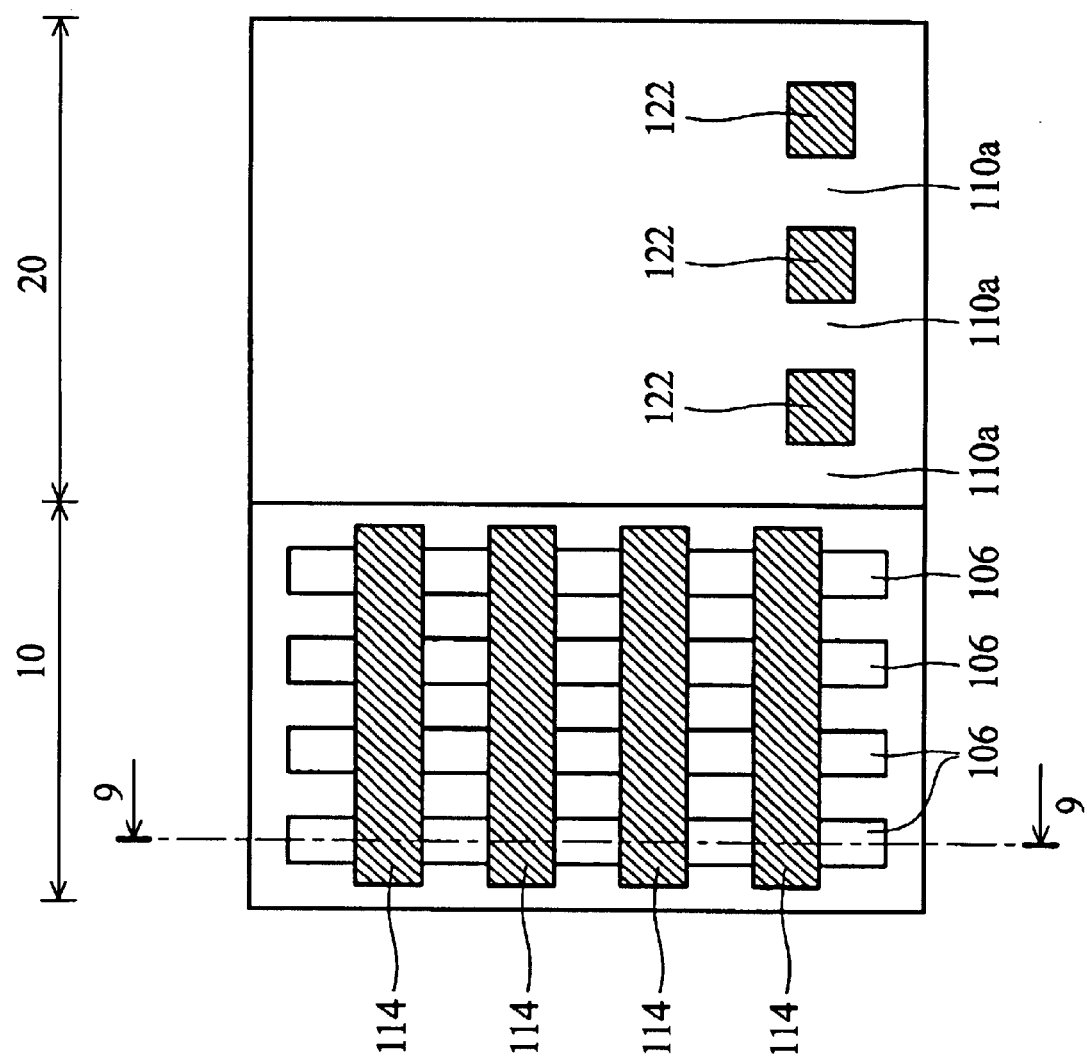
FIG. 9 is a top view of a nitride read-only memory according to the present invention.
Figure 10:
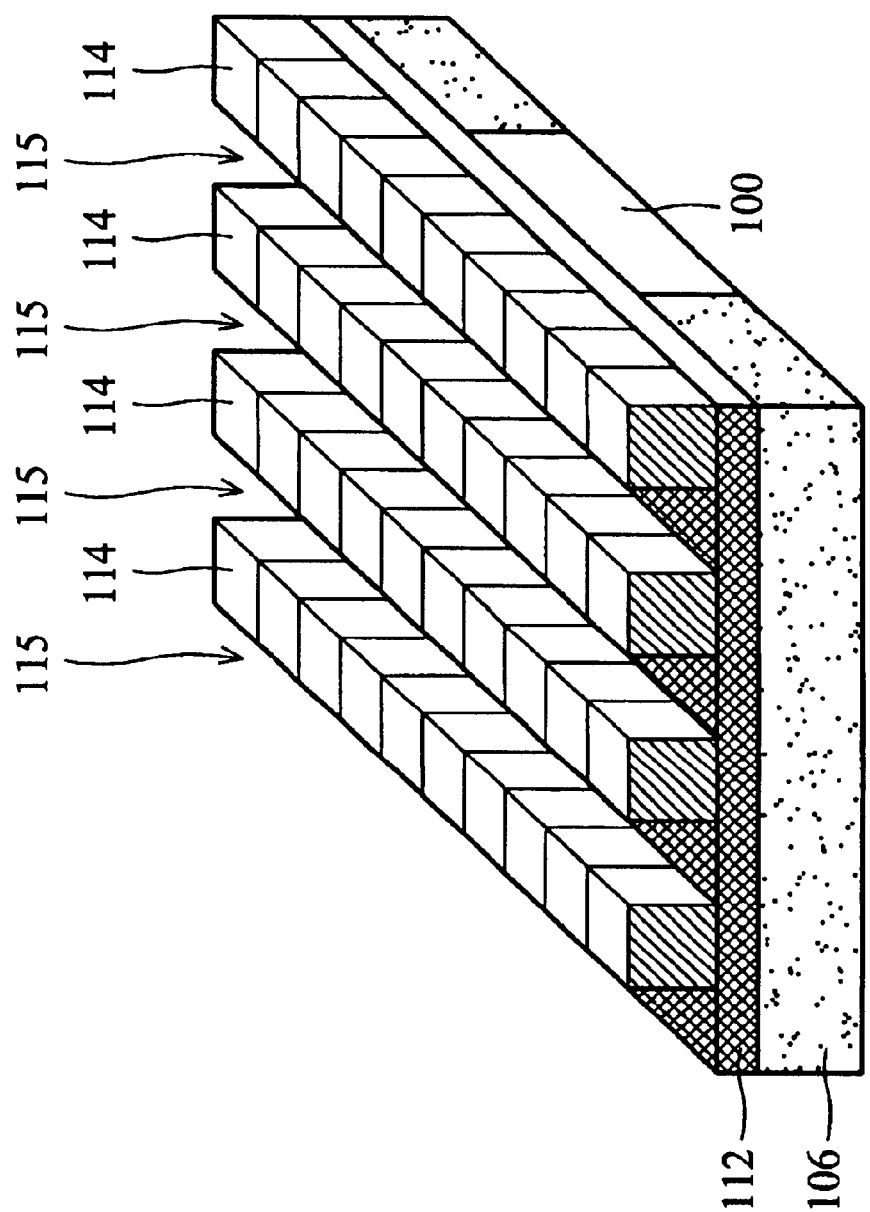

As shown in FIG. 8, normal stripping process exposes the remaining polysilicon layer 114. FIG. 9 and FIG. 10 are schematic diagrams of FIG. 8, wherein FIG. 9 is a top view of memory region 10 including parallel buried bit lines and parallel word lines intersecting the underlying bit lines 114 and the peripheral circuit region 20 including a plurality of active areas 122 and electrical isolation trenches 110a. FIG. 10 is a cross-sections of a memory cell cut along the 9—9 line, wherein parallel bit lines 106 are formed in the substrate 100 with ONO layer 112 conformally formed thereon, and parallel polysilicon layer 114 is formed on the ONO layer intersecting the underlying bit lines 106, and having trenches 115 between the polysilicon structure.

Figure 11:
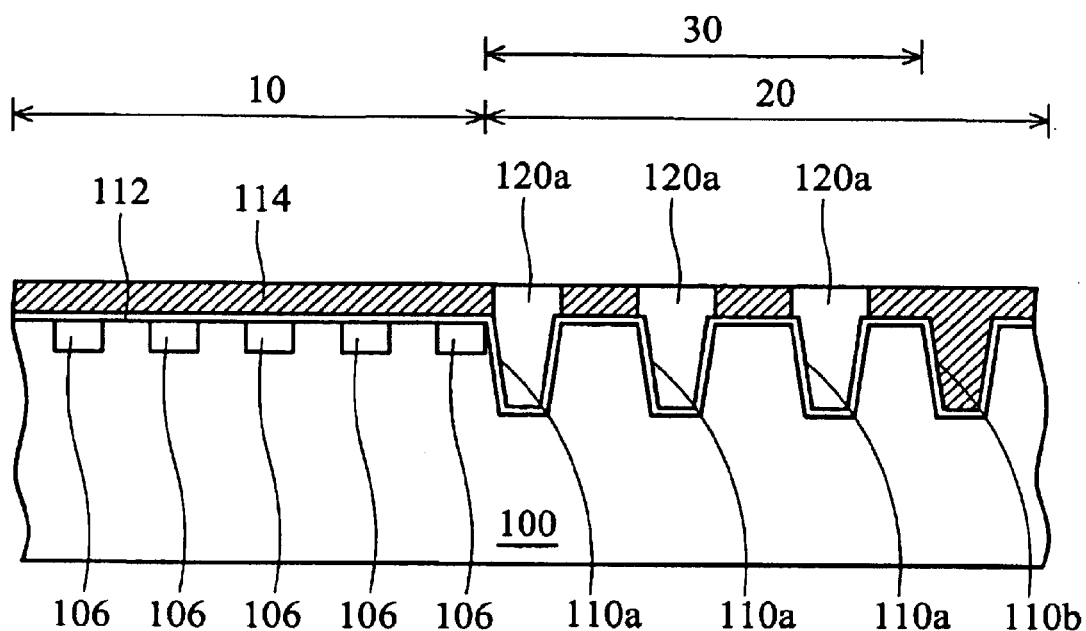

As shown in FIG. 11, an insulator such as an oxide layer 120a is deposited in the first trenches 110a to serve as electrical isolation active area 30, wherein the insulator layer 120b is simultaneously formed between the word lines 115 in the memory array region to prevent semiconductor substrate reaction with metal such as cobalt during salicidation of the polysilicon. The insulator layer can be formed by deposition of an oxide layer by high pressure chemical vapor deposition (HPCVD). The insulator layer 120a deposited in a plurality of the first trenches can isolate the active regions 30 and the insulator layer 120b deposited between the memory array can serve as a metallization mask. Next, a polishing process is performed by utilizing the polysilicon layer 114 as a polishing stop layer to planarize insulator layers 120a and 120b.

Figure 12:
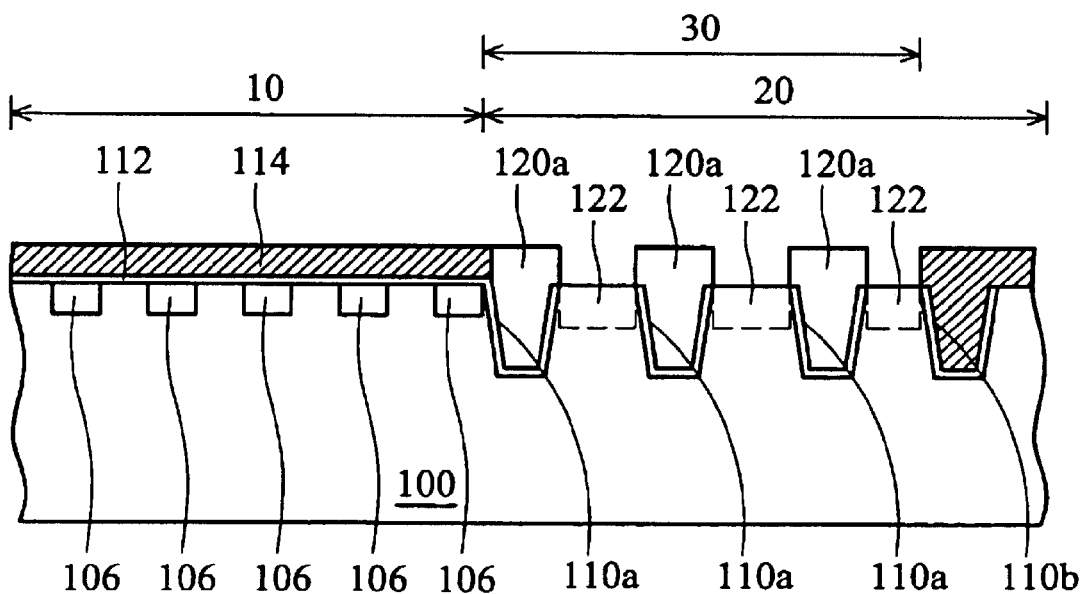

As shown in FIG. 12, selectively etching removes portions of the polysilicon structures 114 and the ONO layer 112 to expose the semiconductor substrate between the first shallow trenches, then ion implantation defines the well regions 122 in the substrate 100 between the first shallow trenches 110a.

The present invention provides a polysilicon layer as word lines in the memory region to serve as an insulator polishing stop layer with the insulator formed in the first shallow trenches in the peripheral region by disposing an oxide layer, the insulator simultaneously formed between polysilicon structures in the memory array region to prevent semiconductor substrate reaction with metal such as cobalt during salicidation of the polysilicon, and an ONO layer formed on the sidewalls of the shallow trenches avoids STI corner recess and profile deformation during thermal process.

What is claimed is:

1. A method of fabricating a nitride read only memory, comprising the steps of:

providing a semiconductor substrate, comprising a memory region and a peripheral circuit region therein;

growing a pad oxide on the semiconductor substrate;

forming a plurality of parallel buried diffusion regions as bit lines in the memory region;

forming a first shallow trench and a second shallow trench in the peripheral circuit region;

conformally forming an ONO film on the semiconductor substrate;

depositing a polysilicon layer on the ONO film to fill the first shallow trenches and the second shallow trench;

selectively etching the polysilicon layer in the memory region to define a plurality of polysilicon structures as word lines having gaps therein, and removing the polysilicon from the first shallow trenches and leaving the polysilicon layer in the second shallow trench in the peripheral circuit region; and forming an insulator in the first shallow trenches and the gaps between the word lines.

2. The method as claimed in claim 1, further comprising:

planarizing the insulator to leave shallow trench isolations in the first shallow trenches and between the word lines;

selectively etching the polysilicon structures and the ONO layer to expose the semiconductor substrate between the first shallow trenches; and implanting dopants into the substrate between the first shallow trenches to define the well regions.

3. The method as claimed in claim 1, wherein the bit lines formation further comprises:

forming a first photoresist pattern with a plurality of parallel first openings on the pad oxide in the memory region to serve as bit line mask;

implanting dopants into the semiconductor substrate to form a plurality of parallel buried diffusion regions as bit lines in the memory region; and removing the bit line mask.

4. The method as claimed in claim 1, wherein the first and the second shallow trench formation further comprises:

forming a second photoresist pattern on the pad oxide, wherein the second photoresist pattern has second openings in the peripheral circuit region;

selectively etching the semiconductor substrate through the second openings to create a first shallow trenche and a second shallow trench; and removing the second photoresist pattern and the pad oxide.

5. The method as claimed in claim 1, wherein the semiconductor substrate is a silicon substrate.

6. The method as claimed in claim 1, wherein the semiconductor substrate is a silicon-on-insulator (SOI) substrate.

7. The method as claimed in claim 1, wherein the pad oxide is formed by thermal oxidation.

8. The method as claimed in claim 1, wherein the buried diffusion regions are formed by implanting n-type ions in the semiconductor substrate.

9. The method as claimed in claim 1, wherein the buried diffusion region is implanted before the ONO layer is formed.

10. The method as claimed in claim 1, wherein the buried diffusion region is implanted after the ONO layer is formed.

11. The method as claimed in claim 1, further comprising rapid thermal anneraling (RTA) after implantation to activate the dopants in the substrate.

12. The method as claimed in claim 1, wherein the bit line mask is a patterned photoresist.

13. The method as claimed in claim 1, wherein thickness of the ONO layer is between about 150 and 250 Å.

14. The method as claimed in claim 1, wherein the ONO layer is further formed on the sidewall of the shallow trench to avoid STI corner recess.

15. The method as claimed in claim 1, wherein the ONO layer is further formed on the sidewall of the shallow trench to avoid deformation of the STI profile during thermal process.

16. The method as claimed in claim 1, wherein the insulator is a silicon dioxide layer.

17. The method as claimed in claim 16, wherein the polysilicon layer comprises a dopant polysilicon layer.

18. The method as claimed in claim 1, wherein the insulator is formed by high density plasma chemical vapor deposition (HDPCVD).

19. The method as claimed in claim 2, wherein the insulator is planarized by chemical mechanical polishing.

* * * * *